United States Patent

Ishimaru et al.

[11] Patent Number: 5,883,051
[45] Date of Patent: Mar. 16, 1999

[54] HIGH TC SUPERCONDUCTING JOSEPHSON JUNCTION ELEMENT

[75] Inventors: Yoshihiro Ishimaru, Yokohama; Jian-Guo Wen, Kawasaki; Kunihiko Hayashi, Misato; Youichi Enomoto, Kanagawa-ken; Naoki Koshizuka, Narashino; Shoji Tanaka, Tokyo, all of Japan

[73] Assignee: International Superconductivity Technology Center, Japan

[21] Appl. No.: 735,117

[22] Filed: Oct. 22, 1996

[30] Foreign Application Priority Data

Oct. 26, 1995 [JP] Japan ................................. 7-278560

[51] Int. Cl.⁶ .................................................. H01L 39/22
[52] U.S. Cl. .......................... 505/190; 505/230; 505/234; 505/238; 505/329; 505/702; 428/699; 428/700; 428/701; 428/702; 428/930
[58] Field of Search ..................... 428/689, 699, 428/700, 701, 702, 930; 505/190, 230, 234, 237, 238, 329, 702

[56] References Cited

U.S. PATENT DOCUMENTS 5,047,385  9/1991  Beasley et al. ........................ 505/325
5,077,266  12/1991  Takagi et al. ......................... 505/329
5,354,734  10/1994  Tanaka et al. ......................... 505/329

OTHER PUBLICATIONS

Mineralogy, Berry–Mason, pp. 43–47, W.H. Freeman and Company, 1959.

Physical Review B, vol. 55, No. 17, 1 May 1997 pp. 11851–11859.

Jpn. J. Appl. Phys. vol. 34 (1995) pp. L1532–L1535, Part 2, No. 11B, 15 Nov. 1995.

M. Grant Norton et al., "Microstructure Development in Thin–Film Superconductors", *Science and Technology of Thin Film Superconductors 2*, Plenum Press, New York, 1990, pp. 379–387.

*Primary Examiner*—Marie Yamnitzky
*Attorney, Agent, or Firm*—Lorusso & Loud

[57] ABSTRACT

A superconducting Josephson junction element including a first, a-axis oriented, superconductive metal oxide crystal grain having a first area of a {001} plane, and a second, c-axis oriented, superconductive metal oxide crystal grain having a second area of a {110} plane, wherein the first and second crystal grains are in contact with each other at the first and second areas to form a grain boundary therebetween.

4 Claims, 6 Drawing Sheets

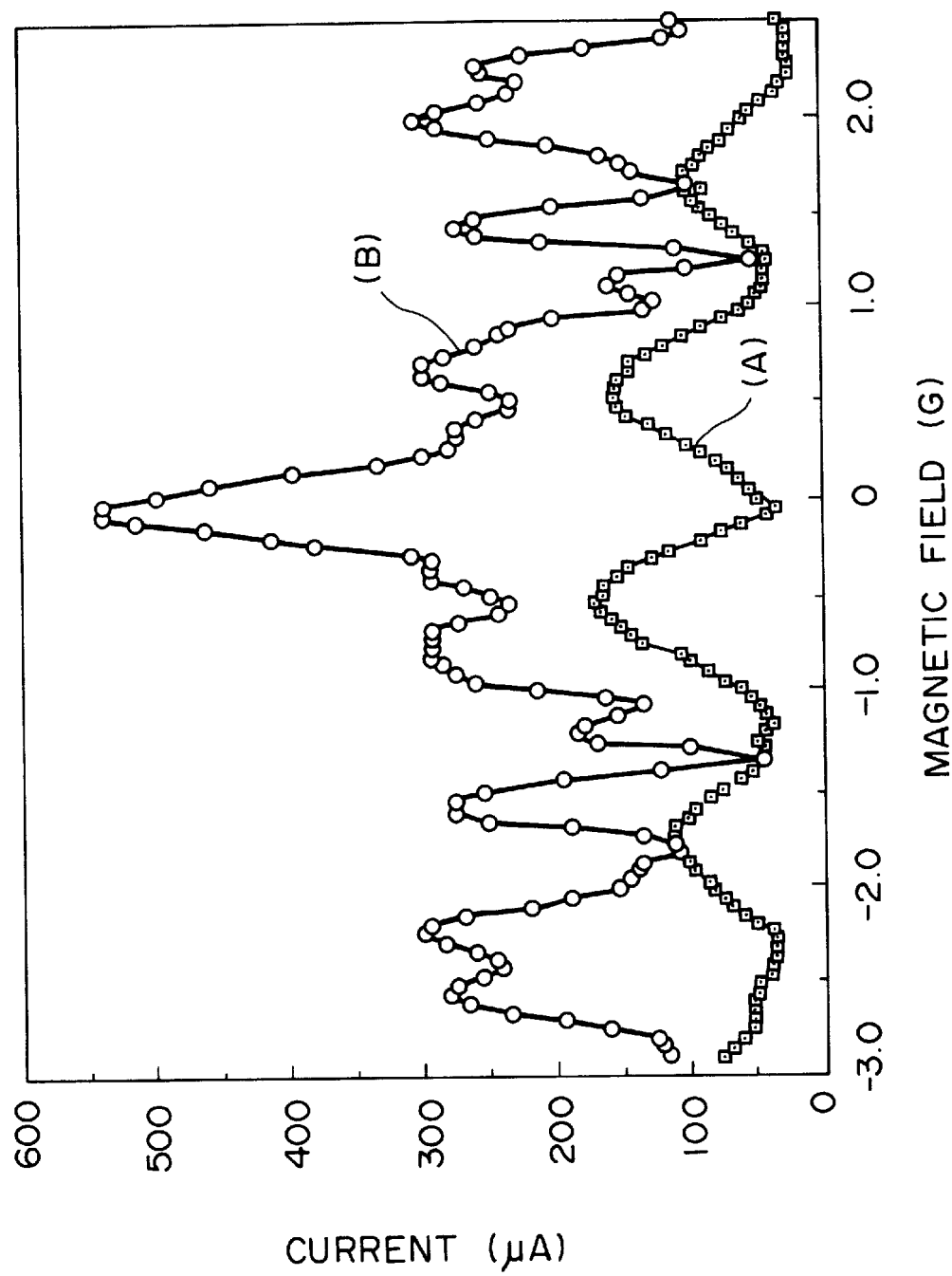

HIGH TC SUPERCONDUCTING JOSEPHSON JUNCTION ELEMENT

BACKGROUND OF THE INVENTION

1. Field of the Invention

This invention relates generally to a high Tc superconducting Josephson junction element and, more particularly, to a superconducting Josephson junction element including a s-d wave junction formed only of a metal oxide superconductor.

2. Description of Prior Art

As a consequence of the development of high Tc superconductors, various superconducting devices operable at liquid nitrogen temperatures have been proposed. Such superconducting devices are expected to show much superior performance as compared with semiconductor devices and to be utilized as SQUIDs, digital devices and radiowave devices.

Superconductivity of known metal superconductors is able to be explained by the BCS theory. It is known that the superconductive energy gap of BCS superconductors is isotropic and has s-wave symmetry. In the case of metal oxide superconductors having a layered structure, on the other hand, there is suggested a possibility that the superconductive energy gap is anisotropic and has d-wave symmetry. However, symmetry of superconductive energy gap of metal oxide superconductors has not yet been clarified.

Recently, Iguchi et al and Wollman et al report that s-d-wave junctions have been formed between a conventional metal superconductor having s-wave symmetry and a metal oxide superconductor having a layered structure (I. Iguchi and Z. Wen, physical Review, vol. B49, p.12388 (1949); and D. A. Wollman, D. J. Van Harlingen, J. G. Giapintzakis and D. M. Ginsberg, physical Review Letters, vol. 74, p.797 (1995)). Namely, a junction element was prepared using a combination of pb having s-wave symmetry with $YBa_2Cu_3O_{7-x}$ (YBCO) film or YBCO single crystal having a layered structure. The junctions were subjected to various tests and were determined as being Josephson junctions.

More particularly, in Wollman et al, a YBCO/Au/pb junction is prepared. In view of the fact that (a) the junction shows current-voltage (I-V) pattern in the form of RSJ (resistivity shunt junction) model peculiar to SNS (superconductor/normal conductor/superconductor) junctions and (b) the maximum critical current flowing through the junction when a magnetic field is applied thereto shows a Fraunhofer-like pattern, the junction is determined as being a Josephson junction. Iguchi et al describe preperation of a YBCO/MgO/Pb junction. In view of the fact that (a) the junction shows a hysteresis in I-N characteristics that is peculiar to SIS (superconductor/insulator/superconductor) junctions and (b) the junction shows a Fraunhofer-like pattern against in a magnetic field, the junction is determined as being a Josephson junction.

In the junctions of Wollman et al and Iguchi et al, the Fraunhofer pattern differs from that of the conventional s-s-wave Josephson junctions using metal superconductors. Namely, whereas the superconductive critical current is maximum at the applied magnetic field of zero in the case of the Fraunhofer patterns of s-s-wave Josephson junctions, the junctions between pb and YBCO film and between pb and YBCO single crystal show minimum critical current at zero magnetic field. On the basis of these facts, it has been concluded that the junctions are s-d-wave junctions. The s-d-wave Josephson junctions are considered to provide superconducting devices having new functions different from the conventional s-s-wave junctions, because of the difference in Fraunhofer patterns therebetween.

In the case of the above s-d-wave Josephson junctions between the metal superconductor and YBCO, the operation temperature is determined by the critical temperature of the metal superconductor which is much lower than the liquid nitrogen temperature (77K). Thus, the known s-d-wave Josephson junctions cannot be integrated with other superconducting devices adapted to operate at the liquid nitrogen temperature.

SUMMARY OF THE INVENTION

It is, therefore, an object of the present invention to provide a s-d-wave Josephson junction operable at high temperatures, especially above the liquid nitrogen temperature.

In accomplishing the foregoing object, there is provided in accordance with the present invention a superconducting Josephson junction element comprising:

a first, a-axis oriented, superconductive metal oxide crystal grain having a first area of a {001} plane; and a second, c-axis oriented, superconductive metal oxide crystal grain having a second area of a {110} plane;

said first and second crystal grains are in contact with each other at said first and second areas to form a grain boundary therebetween.

BRIEF DESCRIPTION OF THE DRAWINGS

Other objects, features and advantages of the present invention will become apparent from the detailed description of the preferred embodiments of the invention which follows, when considered in light of the accompanying drawings, in which:

FIG. 6 shows dependence of superconductive current on applied magnetic field in the Josephson junction element, of the present invention.

DESCRIPTION OF THE PREFERRED EMBODIMENTS

Figure 1:
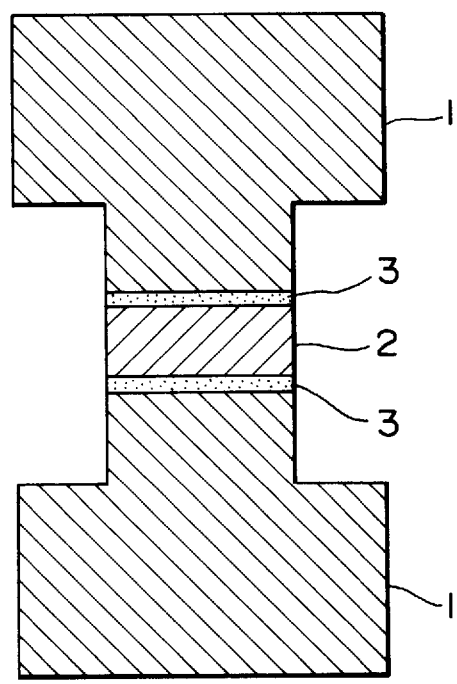
FIG. 1 is a schematic illustration of one embodiment of a superconducting Josephson junction element according to the present invention.

Referring to FIG. 1, a superconducting Josephson junction element according to the present invention includes a first, a-axis oriented, superconductive metal oxide crystal grain 2 having a first area of a {001} plane, and a second, c-axis oriented, superconductive metal oxide crystal grain 1 having a second area of a {110} plane. Located between the first grain 2 and second crystal grain 1 is a grain boundary 3 at which the first area of the first crystal grain 2 is in contact with the second area of the second crystal grain 1. In the specific embodiment shown in FIG. 1, the first crystal grain 2 is disposed between a pair of the second crystal grains 1 and 1 so that there are formed two crystal boundaries 3 and 3 therebetween.

Since the c-axis oriented crystal grain 1 has a {001} plane at the a/c grain boundary 3, the grain boundary shows d-wave symmetry. Further, a layer exhibiting N-like (normal conductivity-like) behavior is formed in the grain boundary 3, so that a Josephson junction of SNS-type is formed.

The Josephson junction according to the present invention may be prepared as follows.

Figure 2A:
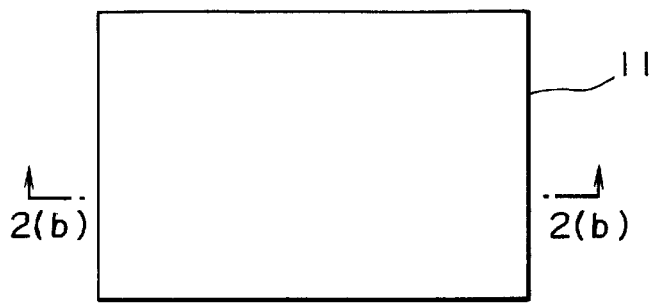
FIGS. 2(a), 2(c) and 2(e) are top views diagrammatically illustrating steps for the fabrication of the Josephson junction according to the present invention.
Figure 2B:
FIGS. 2(b), (d) and 2(f) are sectional views taken on lines B—B, D—D and F—F in FIGS. 2(a), 2(c) and 2(e), respectively.

Over a surface of a substrate 11 as shown in FIGS. 2(a) and 2(b), a YBCO film 10 having a thickness of 100–300 nm is formed by, for example, pulsed laser deposition (laser abrasion method) using KrF laser. The pulsed laser deposition may be performed using YBCO polycrystals as a target under conditions involving a substrate temperature of 750°–800° C., an oxygen gas pressure of 100–300 mTorr and a laser power of 1.5–2.5 J/cm$^2$.

Figure 2C:
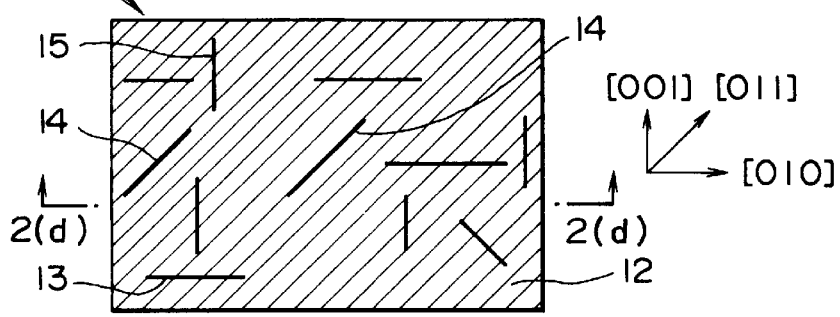
Figure 2D:
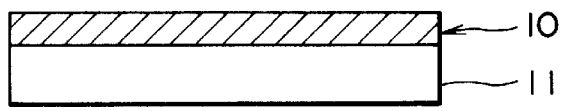

As shown in FIGS. 2(c) and 2(d), the YBCO film 10 thus obtained is composed of c-axis oriented YBCO grain 12 and a-axis oriented YBCO grains 13, 14 and 15 dispersed in the c-axis oriented YBCO grain domain 12.

Figure 2E:
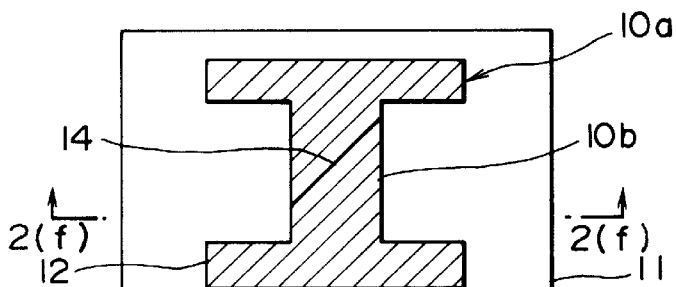
Figure 2F:
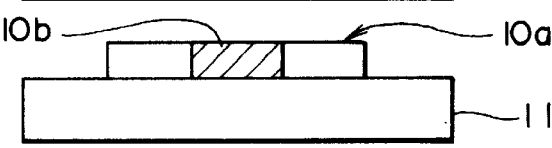

Next, as shown in FIGS. 2(e) and 2(f), the YBCO film 10 is patterned to leave an I-shaped region 10a composed of the c-axis oriented grain 12 and the a-axis oriented grain 14 and having a necked portion 10b extending across the a-axis oriented grain 14 oriented in the <011> direction to obtain a junction as illustrated in FIG. 1. Electrical contacts (not shown) can be made for connection to appropriate bias sources to complete the device.

The patterning can be done by any suitable known way such as by an ion milling method using a photoresist mask. The ion milling may be performed using Ar ion at a voltage of 350–500 V and under an Ar pressure of 0.01–0.1 Pa. The electrical contacts may be formed by, for example, Au sputtering using a metal mask.

Figure 3:
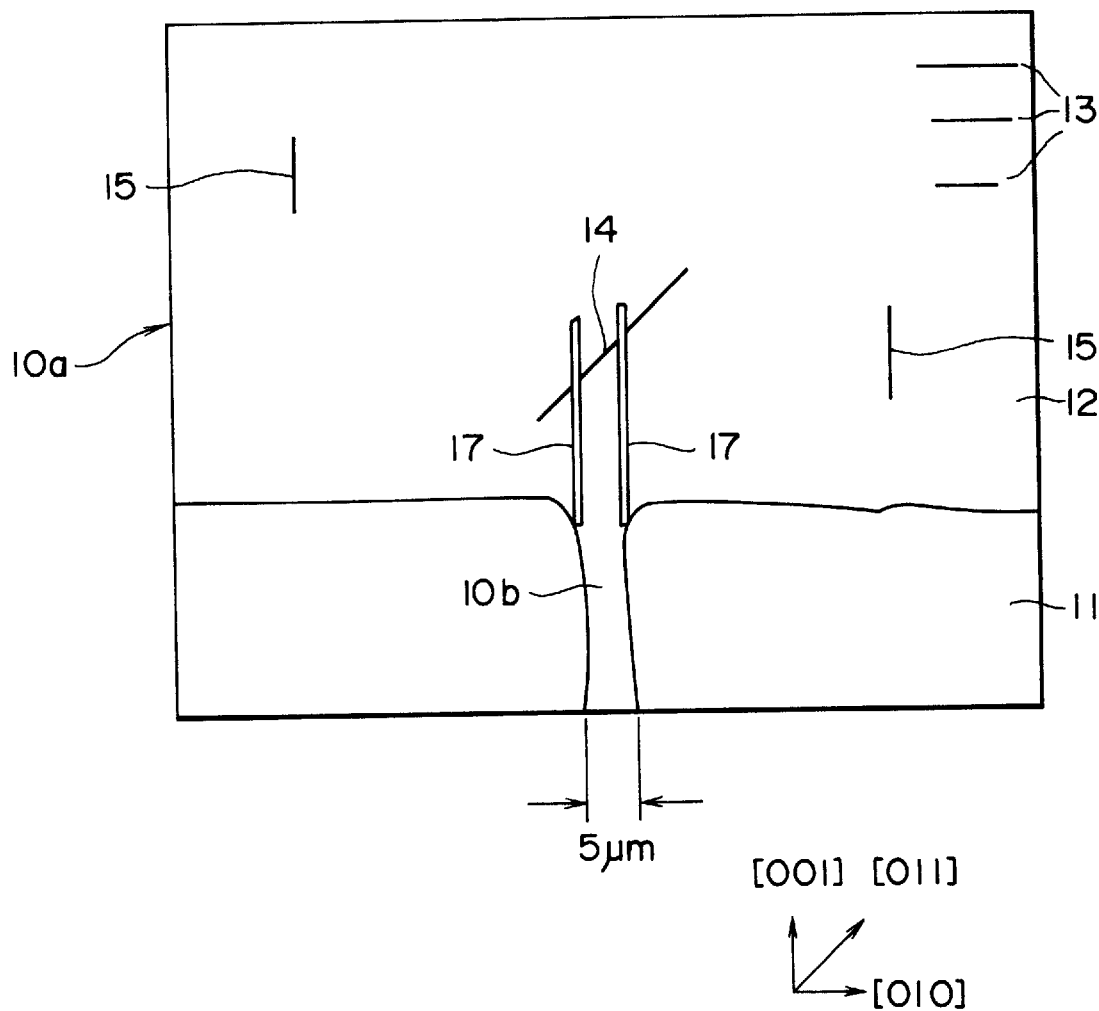
FIG. 3 is a fragmentary top view showing an embodiment of the Josephson junction element according to the present invention.

FIG. 3 is a sketch of an optical photomicroscopic view of part of a Josephson junction according to the present invention, in which the same reference numerals as those in FIGS. 2(a)–2(f) designate the similar components. In this embodiment, a necked portion (width: 5 μ) 10b of the patterned YBCO film 10a does not cross the a-axis oriented grain 14. A pair of trenches 17 and 17, extending from both sides of the necked portion 10b and each crossing the a-axis oriented grain 14, are formed by a focused ion beam method using Ga ion. Each of the trenches 17 and 17 has a depth reaching the MgO substrate 11. As a result of the above construction the two regions of the I-shaped patterned YBCO film 10 on either side of the a-axis oriented grain 14 are separated from each other, so that a Josephson junction is formed.

In lieu of YBCO (YBa$_2$Cu$_3$O$_{7-x}$), the Josephson junction element according to the present invention can use any other high Tc superconductor having a layer structure, such as NdBa$_2$Cu$_3$O$_{7-x}$, SmBa$_2$Cu$_3$O$_{7-x}$, EuBa$_2$Cu$_3$O$_{7-x}$, DyBa$_2$Cu$_3$O$_{7-x}$, GdBa$_2$Cu$_3$O$_{7-x}$, HoBa$_2$Cu$_3$O$_{7-x}$, ErBa$_2$Cu$_3$O$_{7-x}$, TmBa$_2$Cu$_3$O$_{7-x}$, or YbBa$_2$Cu$_3$O$_{7-x}$. In some superconductors having a layer structure, it is impossible to discriminate the a-axis from the b-axis. In this sense, the term "a-axis" used in the present specification and claims is intended to also refer to "b-axis".

The following example will further illustrate the present invention.

EXAMPLE

A Josephson junction element according to the present invention was prepared in a manner as described above with reference to FIGS. 2(a)–2(f). Thus, over a (100) plane of a MgO single crystal substrate 11 as shown in FIGS. 2(a) and 2(b), a YBCO film 10 having a thickness of 248 nm was formed by pulsed laser deposition using KrF laser having a wave length of 248 nm. The pulsed laser deposition was performed using YBa$_2$Cu$_3$O$_{7-x}$ polycrystals as a target at a substrate temperature of 780° C., an oxygen gas pressure of 200 mTorr and a laser power of 2.0 J/cm$^2$.

As shown in FIGS. 2(c) and 2(d), the YBCO film 10 thus obtained was composed of c-axis oriented YBCO grain 12 and a-axis oriented YBCO grains 13, 14 and 15 dispersed in the c-axis oriented YBCO grain domain 12 and having a length of 5–20 μm and a width of 0.05–0.2 μm. The longitudinal axes of the a-axis oriented YBCO grains 13, 14 and 15 were oriented in the directions parallel with <010>, <011> and <001> directions, respectively, of the substrate 11. It is believed that the a-axis oriented grains 13, 14 and 15 are formed as a result of fine step structures of a 10 Å order on the MgO single crystal substrate 11 and of the specific pulsed laser deposition temperature.

Figure 4:
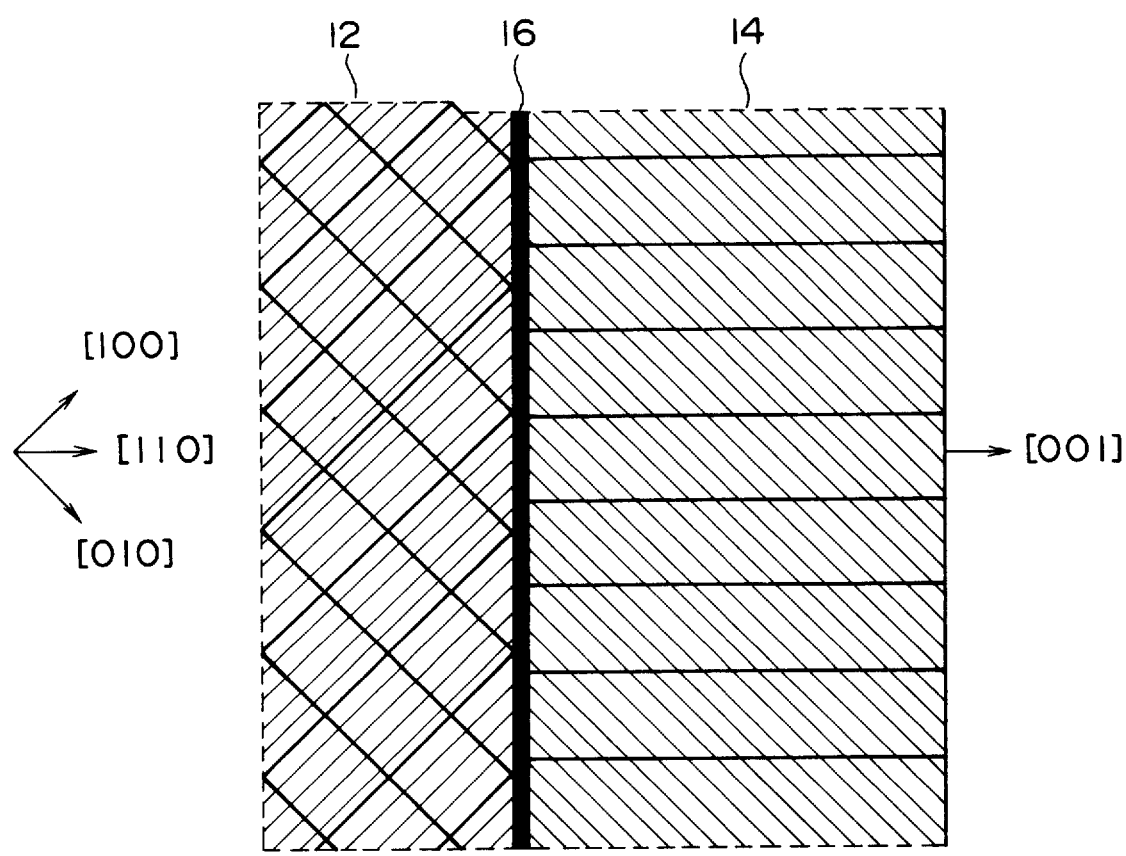
FIG. 4 is a top view schematically illustrating the Josephson junction according to the present invention.

Next, as shown in FIGS. 2(e) and 2(f), the YBCO film 10 was patterned by an ion milling method using a photoresist mask. The ion milling was performed using Ar ion at a voltage of 450 V and under an Ar pressure of 0.02 Pa to leave an I-shaped region 10a composed of the c-axis oriented grain 12 and the a-axis oriented grain 14 and having a necked portion 10b extending across the a-axis oriented grain 14 oriented in the <011> direction to obtain a junction as schematically illustrated in FIG. 4. Designated as 16 is a, grain boundary formed between the (110) plane of the c-axis oriented YBCO film 12 and the (001) plane of the a-axis oriented YBCO crystal grain 14. Electrical contacts (not shown) were then made by Au sputtering using a metal mask for connection to bias sources to complete the device.

Figure 5A:
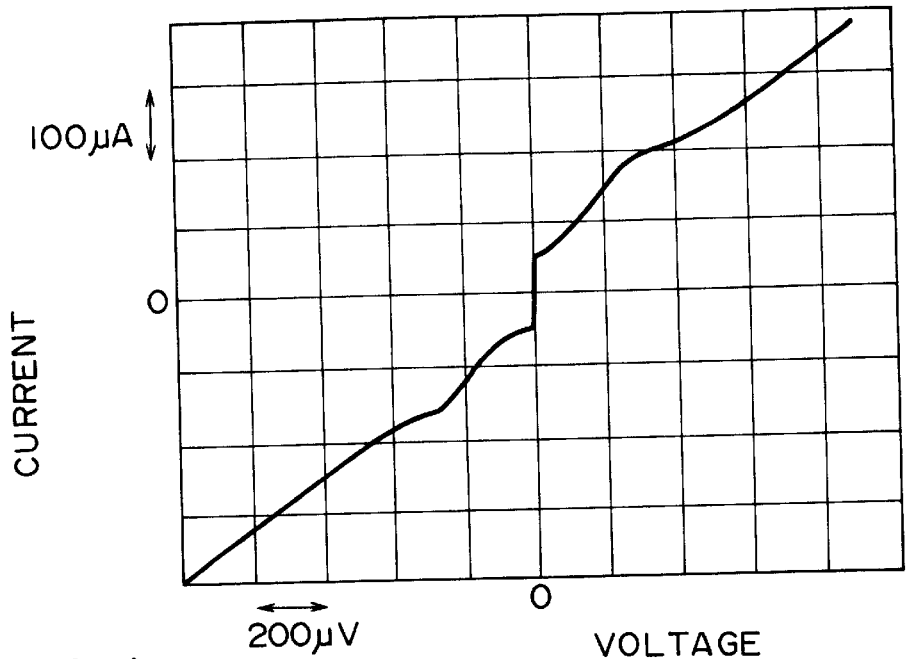
FIG. 5(a) shows a relationship between the current and voltage of the Josephson junction element of the present invention.

FIG. 5(a) is current-voltage characteristic of the junction thus obtained. The characteristic of RSJ model peculiar to weak link-type junctions, i.e. SNS structure, is seen. Therefore, the region of the a/c boundary 16 is considered to be N-like in behavior.

Figure 5B:
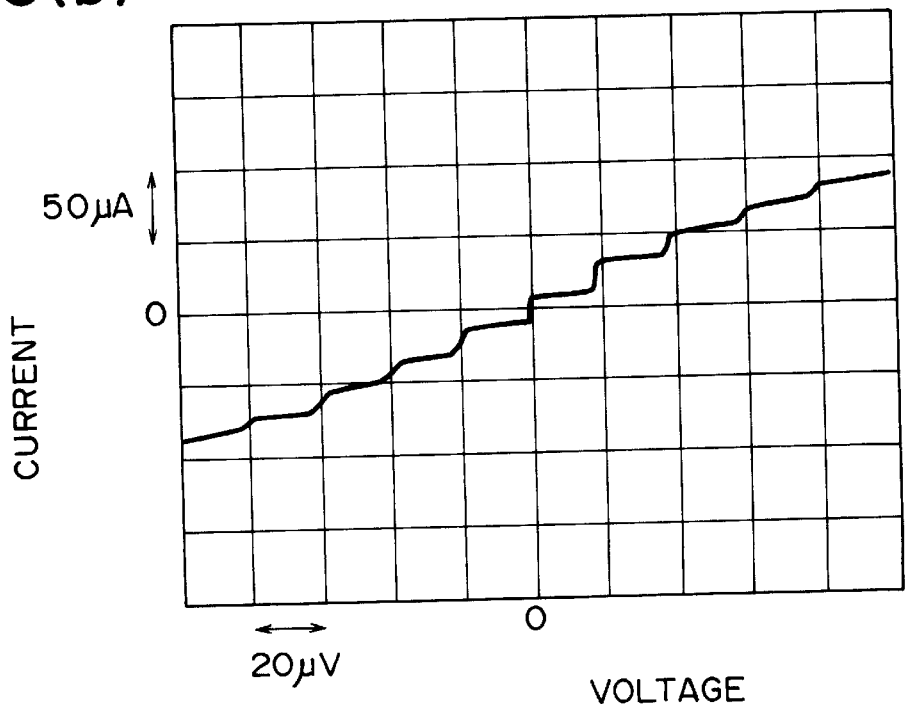
FIG. 5(b) shows a relationship between the current and voltage in the Josephson junction element of the present invention with microwave radiation.

FIG. 5(b) is current-voltage characteristic of the above junction with microwave radiation at a frequency of 9.29 GHz and a power of 0.1 μW. Shapiro steps characteristic of Josephson junctions are observed.

FIG. 6 shows critical current-applied magnetic field characteristic at 18K for the above junction (curve (A)). The Fraunhofer pattern of the junction according to the present invention is such that the superconductive current is minimum at the zero applied magnetic field and periodically and symmetrically changes as the applied magnetic field (absolute value) increases. In contrast, in the case of the conventional s-s wave junctions (curve B), the current is maximum at the zero applied magnetic field. The Josephson junction according to the present invention is, therefore, considered to be s-d wave junction. Since the contacting plane of the c-axis oriented film 12 is a (110) plane in the a/c grain boundary 16, the c-axis oriented grain region 12 shows d-wave symmetry, to thereby form the s-d wave junction.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all the changes which come within the meaning and range of equivalency of the claims are therefore intended to be embraced therein.

What is claimed is:

1. A superconducting Josephson junction element comprising:
    a first, a-axis oriented, superconductive metal oxide crystal grain having a first area of a {001} plane; and
    a second, c-axis oriented, superconductive metal oxide crystal grain having a second area of a {110} plane;
    said first and second crystal grains being in contact with each other at said first and second areas to form a grain boundary therebetween.

2. A superconducting Josephson junction element as claimed in claim 1, further comprising a substrate of MgO having a {100} plane on which said a-axis oriented grain is formed, said a-axis oriented grain having a longitudinal axis oriented in the direction parallel with the [011] direction of said substrate.

3. A superconducting Josephson junction element as claimed in claim 1, wherein the superconductive metal oxides of said first and second crystal grains are independently selected from the group consisting of $YBa_2Cu_3O_{7-x}$ and $NdBa_2Cu_3O_{7-x}$ where x is a number of 0–1.

4. A superconducting Josephson junction element as claimed in claim 2, wherein the superconductive metal oxides of said first and second crystal grains are independently selected from the group consisting of $YBa_2Cu_3O_{7-x}$ and $NdBa_2CU_3O_{7-x}$ where x is a number of 0–1.

* * * * *

UNITED STATES PATENT AND TRADEMARK OFFICE
CERTIFICATE OF CORRECTION

PATENT NO. : 5,883,051
DATED : March 16, 1999
INVENTOR(S) : ISHIMARU et al

It is certified that error appears in the above-identified patent and that said Letters Patent is hereby corrected as shown below:

On the title page, item [75], Inventors:

"Youichi Enomoto, Kanagawa-ken" should read --Youichi Enomoto, Naka-gun--.

Col. 1, line 37, "pb" should read --Pb--;
       line 43, "pb" should read --Pb--; and
       line 64, "pb" should read --Pb--, both instances.

Col. 3, line 50, "$\mu)$" should read --$\mu m)$--.

Signed and Sealed this

Eleventh Day of July, 2000

Attest:

Q. TODD DICKINSON

*Attesting Officer*  *Director of Patents and Trademarks*